United States Patent
Kimoto

(10) Patent No.: US 11,251,148 B2
(45) Date of Patent: Feb. 15, 2022

(54) SEMICONDUCTOR DEVICES INCLUDING ARRAY POWER PADS, AND ASSOCIATED SEMICONDUCTOR DEVICE PACKAGES AND SYSTEMS

(71) Applicant: Micron Technology, Inc., Boise, ID (US)

(72) Inventor: Hisamitsu Kimoto, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 16/774,911

(22) Filed: Jan. 28, 2020

(65) Prior Publication Data

US 2021/0233880 A1    Jul. 29, 2021

(51) Int. Cl.
*H01L 23/00* (2006.01)
*H01L 25/065* (2006.01)

(52) U.S. Cl.
CPC .......... *H01L 24/06* (2013.01); *H01L 25/0657* (2013.01); *H01L 2224/06135* (2013.01); *H01L 2224/06137* (2013.01); *H01L 2225/06527* (2013.01); *H01L 2225/06562* (2013.01); *H01L 2924/1434* (2013.01)

(58) Field of Classification Search
CPC combination set(s) only.
See application file for complete search history.

(56) References Cited

U.S. PATENT DOCUMENTS

| | | | |
|---|---|---|---|
| 5,841,784 A * | 11/1998 | Chan | G06F 11/2733 714/718 |
| 10,020,252 B2 | 7/2018 | Miura et al. | |
| 10,141,932 B1 | 11/2018 | Sato | |
| 10,304,497 B2 | 5/2019 | Nishizaki | |
| 10,679,723 B1 * | 6/2020 | Lee | H01L 22/14 |
| 2002/0110041 A1 * | 8/2002 | Kono | G11C 8/18 365/230.08 |

(Continued)

OTHER PUBLICATIONS

Hamada et al., Routing for Power Signals Including a Redistribution Layer, U.S. Appl. No. 16/366,100, filed Mar. 27, 2019.

(Continued)

*Primary Examiner* — Mamadou L Diallo
(74) *Attorney, Agent, or Firm* — TraskBritt

(57) ABSTRACT

Semiconductor devices are disclosed. According to some embodiments, a semiconductor device may include a memory array area and a peripheral area. The memory array area may include a number of memory cells and a number of array pads configured to receive an input voltage. The peripheral area may include a number of peripheral pads for interfacing with the memory array area. In these or other embodiments, the peripheral area may be arranged adjacent to a first edge of the semiconductor device and the number of array pads may be arranged proximate to a second edge of the semiconductor device. The second edge may be perpendicular to the first edge. The memory array area may also include an array distribution conductor configured to variously electrically connect the number of memory cells to the number of array pads. A semiconductor-device package and system are also disclosed.

21 Claims, 9 Drawing Sheets

(56) References Cited

U.S. PATENT DOCUMENTS

| | | | |
|---|---|---|---|
| 2010/0055809 A1* | 3/2010 | Pak | H01L 22/34 |
| | | | 438/17 |
| 2010/0301466 A1* | 12/2010 | Taoka | H01L 23/5283 |
| | | | 257/686 |
| 2018/0062092 A1* | 3/2018 | Jeong | H01L 27/323 |
| 2018/0277219 A1* | 9/2018 | Ematsu | H01L 27/11526 |
| 2019/0304955 A1 | 10/2019 | Sasaki et al. | |
| 2020/0098776 A1* | 3/2020 | Sugisaki | H01L 27/1157 |
| 2020/0365215 A1* | 11/2020 | Min | G11C 5/145 |
| 2020/0365216 A1* | 11/2020 | Baek | G11C 16/10 |
| 2020/0411107 A1* | 12/2020 | Yu | G11C 7/1084 |
| 2021/0082879 A1* | 3/2021 | Sanuki | H01L 27/11573 |
| 2021/0082896 A1* | 3/2021 | Harashima | H01L 27/11556 |
| 2021/0082946 A1* | 3/2021 | Nakajima | H01L 27/11556 |
| 2021/0151450 A1* | 5/2021 | Or-Bach | H01L 27/1116 |

OTHER PUBLICATIONS

He et al., Methods for Adjusting Memory Device Refresh Operations Based on Memory Device Temperature, and Related Memory Devices and Systems, U.S. Appl. No. 16/567,155, filed Sep. 11, 2019.

Yoshida et al., Centralized Placement of Command and Address in Memory Devices, U.S. Appl. No. 16/365,168, filed Mar. 26, 2019.

Yoshida, Kazuhiro, Centralized Placement of Command and Address Swapping in Memory Devices, U.S. Appl. No. 16/365,218, filed Mar. 26, 2019.

\* cited by examiner

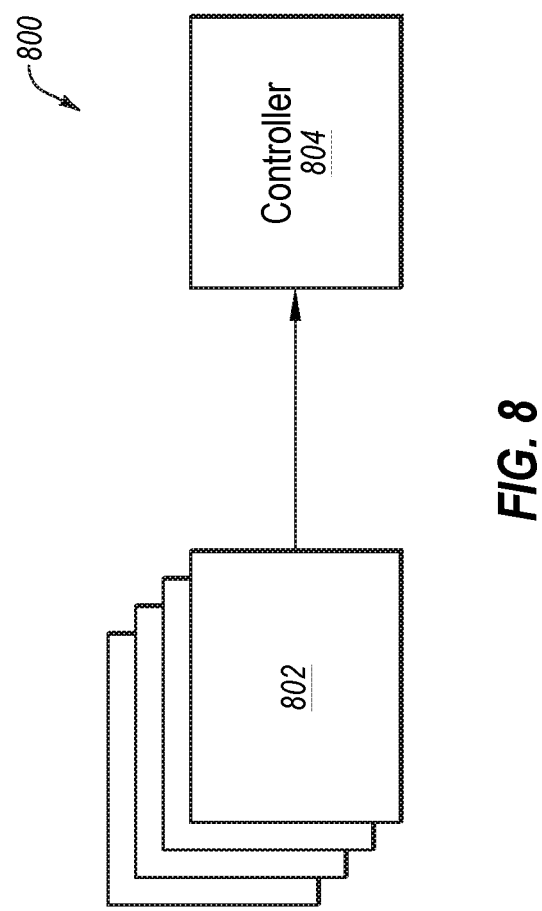

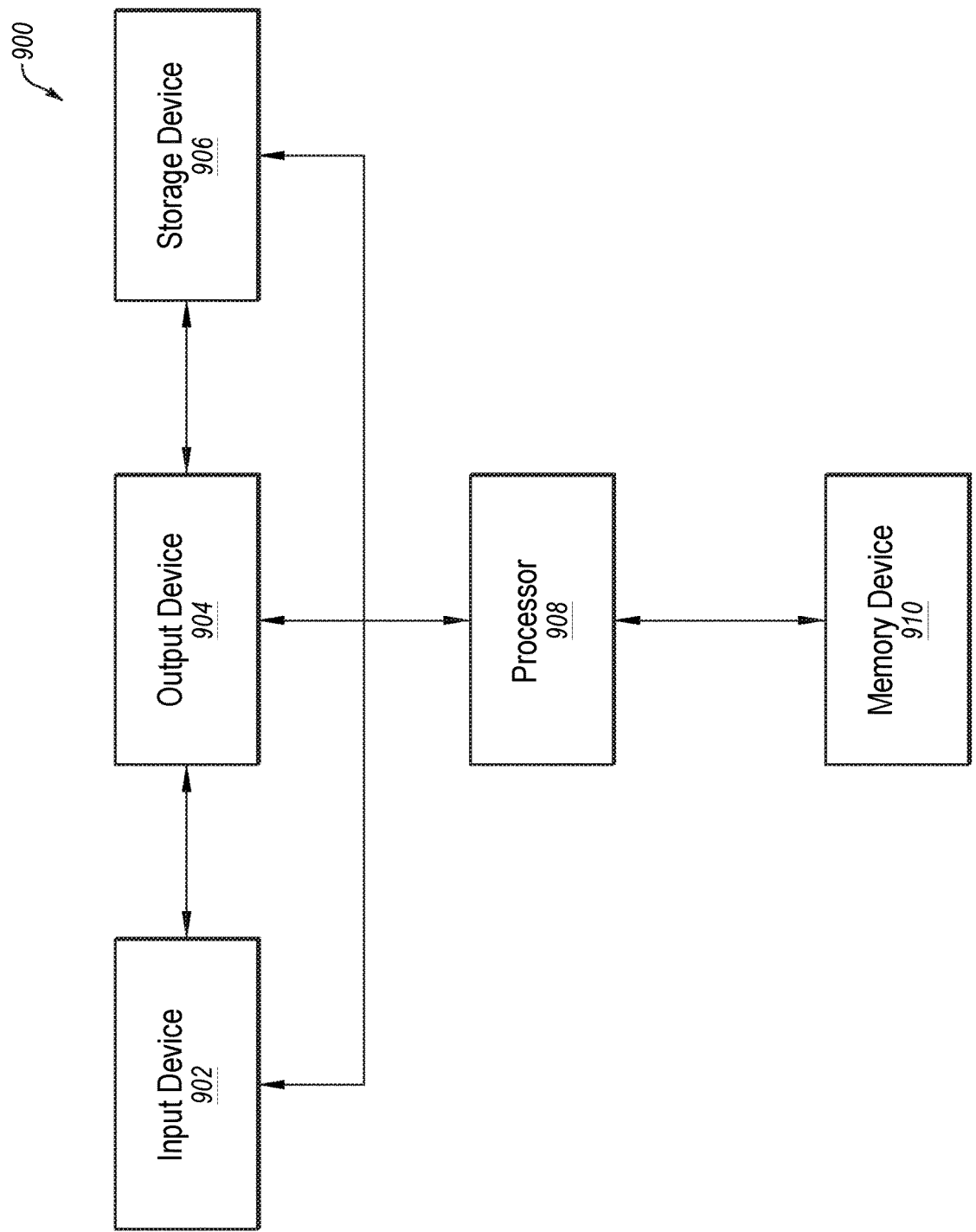

SEMICONDUCTOR DEVICES INCLUDING ARRAY POWER PADS, AND ASSOCIATED SEMICONDUCTOR DEVICE PACKAGES AND SYSTEMS

TECHNICAL FIELD

Embodiments of the disclosure relate to semiconductor devices. More specifically, various embodiments relate to semiconductor devices including array power pads, and associated semiconductor device packages and systems.

BACKGROUND

A semiconductor device may include a peripheral area. The peripheral area may include pads for forming various electrical connections to other devices. The electrical connections between the semiconductor device and the other devices may provide for power transmission and/or data transmission, without limitation.

As an example, a semiconductor device may comprise a memory device. A memory device may include a memory array area including memory cells configured to store data. The memory device may also include a peripheral area including pads for forming electrical connections between other devices and the memory device. Power may be supplied to the memory device through one or more pads in the peripheral area. Additionally, data may be written to and/or read from the memory device through one or more pads in the peripheral area.

In some cases, one or more of the electrical connections between the semiconductor device and other devices may be affected by another one of the one or more electrical connections. For example, a data transmission may be affected by crosstalk from a power transmission.

BRIEF DESCRIPTION OF THE DRAWINGS

FIG. 8 illustrates a simplified block diagram of an example memory system, in accordance with various embodiments of the present disclosure.

FIG. 9 illustrates a simplified block diagram of an example electronic system, in accordance with various embodiments of the present disclosure.

DETAILED DESCRIPTION

Figure 1:
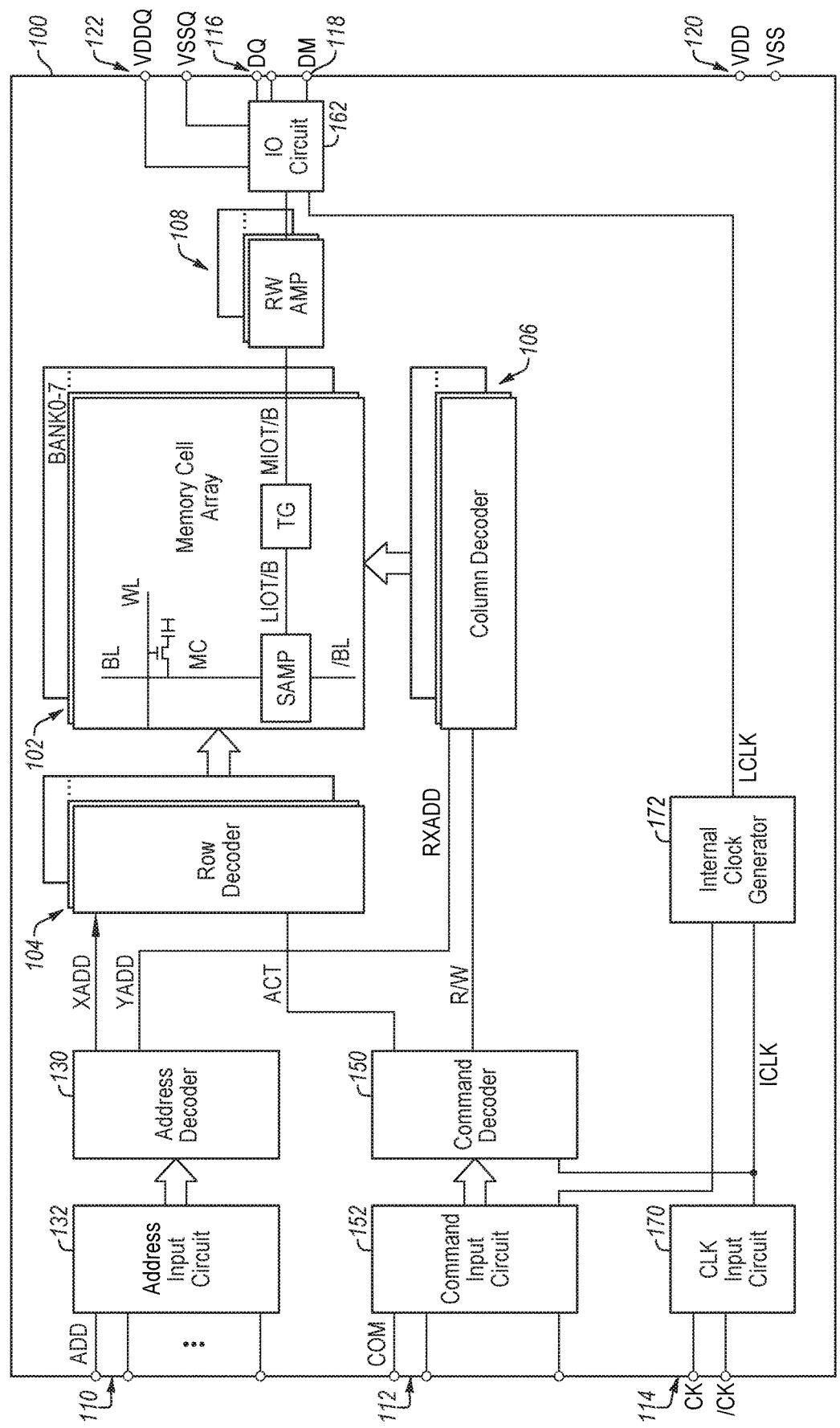
FIG. 1 illustrates a block diagram of an example memory device, in accordance with at least one embodiment of the present disclosure.

A semiconductor device may include pads configured to provide for electrical connections between a semiconductor device and one or more other devices. The pads may provide an interface between the semiconductor device and the one or more other devices. As an example, one or more pads of the semiconductor device may be configured to receive power (e.g., from a power source) for the semiconductor device and one or more pads may be configured to provide for data input to and/or data output from the semiconductor device. The pads may be arranged in a peripheral area of the semiconductor device. The peripheral area, including the pads, may be arranged on a first edge of the semiconductor device. This arrangement may provide a schematically simple interface between the semiconductor device and the other devices.

As will be appreciated, routing multiple electrical signals through the peripheral area (and/or through adjacent or closely spaced pads) may result in noise (e.g., crosstalk) between the various electrical signals. For example, routing power signals, clock signals, and data signals through adjacent, or closely spaced, electrical lines and/or pads may result in noise on one or more of the electrical lines.

One or more embodiments of the present disclosure may include a semiconductor device including a peripheral area including one or more pads ("peripheral pads") and a memory array area including one or more pads ("array pads"). The peripheral pads may be the same as or analogous to the array pads, the difference being that the peripheral pads may be arranged in the peripheral area whereas the array pads may be arranged in the memory array area. The peripheral pads may be configured to receive power for the peripheral area and/or to provide for data input and output for the semiconductor device (including, e.g., providing an interface for the memory array area). The peripheral area may include a distribution conductor configured to interconnect peripheral circuits and the peripheral pads. The distribution conductor arranged in the peripheral area, or primarily in the peripheral area, may be referred to as a "peripheral distribution conductor" to distinguish it from a distribution conductor that may be arranged in the memory array area. The array pads may be configured to receive power for the memory array area. The memory array area may include an array distribution conductor (so termed to distinguish the array distribution conductor from the peripheral distribution conductor) that may be arranged, or primarily arranged in the memory array area and may be configured to interconnect memory cells of the memory array area with the array pads. In some embodiments, the peripheral distribution conductor and/or the peripheral pads of the peripheral area may be electrically isolated (e.g., by being physically separated and/or electrically insulated) from the array distribution conductor and/or the array pads of the memory array area. This electrical isolation may reduce the amount of noise between one or more electrical signals of the semiconductor device.

For example, the peripheral area may include peripheral pads, peripheral circuits, and a peripheral distribution conductor configured to provide data input and output paths for the semiconductor device (including, e.g., the memory array area including the memory cells). The memory array area may include array pads and an array distribution conductor configured to provide power to memory cells of the semiconductor device. The data input and output paths may be electrically isolated from a power path of the memory array area. This arrangement may lessen electrical interference (e.g., noise) of electrical signals associated with power supplied to the memory cells on data signals as compared with other arrangements.

In some embodiments, the peripheral area, including the one or more peripheral pads may be arranged along a first edge of the semiconductor device and the array pads of the memory array area may be arranged along a second edge of the semiconductor device. In some embodiments, the second edge may be perpendicular to the first edge. In some embodiments, the second edge may be longer than the first edge.

One or more embodiments of the present disclosure may include a semiconductor-device package including two or more semiconductor devices. For example, the two or more semiconductor devices may be stacked (e.g., one on top of the other) in the semiconductor-device package. Each of the two or more semiconductor devices may include peripheral pads proximate (e.g., adjacent) a first edge and array pads proximate (e.g., adjacent) a second edge. In some embodiments, the semiconductor devices may be rotated relative to one another when the semiconductor devices are stacked in the semiconductor-device package. Specifically, for example, the semiconductor devices may be arranged such that a first edge of a first semiconductor device is opposite a corresponding first edge of a second semiconductor device that is stacked on top of the first semiconductor device and a second edge of the first semiconductor device is opposite a corresponding second edge of the second semiconductor device. Additionally, a third semiconductor device stacked on top of the second semiconductor device may be arranged such that a first edge of the third semiconductor device is substantially aligned with (e.g., above) the corresponding first edge of the first semiconductor device (and opposite the corresponding first edge of the second semiconductor device) and a second edge of the third semiconductor device is substantially aligned with (e.g., above) the corresponding second edge of the first semiconductor device (and opposite the second edge of the second semiconductor device).

Although various embodiments are described herein with reference to memory devices, the present disclosure is not so limited, and the embodiments may be generally applicable to microelectronic devices and/or semiconductor devices that may or may not include memory devices.

FIG. 1 illustrates a block diagram of an example memory device 100, according to various embodiments of the present disclosure. Memory device 100, which may be referred to herein as a semiconductor device or a microelectronic device, may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). Memory device 100, which may be integrated on a semiconductor chip, may include a memory array 102.

In the embodiment of FIG. 1, memory array 102 is shown as including eight memory banks BANK0-7. More or fewer memory banks may be included in memory array 102 of other embodiments. Each memory bank includes a number of access lines (word lines WL), a number of data lines (bit lines BL) and/BL, and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7. The memory cell MC of FIG. 1 is illustrated using a capacitor as may be common in a DRAM memory cell for illustration purposes only. Principles of this disclosure apply to other types of memory cells, including, as a non-limiting example, SRAM memory cells.

Bit lines BL and/BL are coupled to a respective sense amplifier SAMP. Read data from bit line BL or/BL may be amplified by sense amplifier SAMP, and transferred to read/write amplifiers 108 over complementary local data lines (LIOT/B), transfer gate (TG), and complementary main data lines (MIOT/B). Conversely, write data outputted from read/write amplifiers 108 may be transferred to sense amplifier SAMP over complementary main data lines MIOT/B, transfer gate TG, and complementary local data lines LIOT/B, and written in memory cell MC coupled to bit line BL or/BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminal 120 and power supply terminal 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifiers 108, an input/output circuit 162, and data terminals 116. Further, in response to active command ACT, a write signal, a row address XADD, and a column address YADD, write data may be supplied to memory array 102 via data terminals 116, input/output circuit 162, read/write amplifiers 108, transfer gate TG, and sense amplifier SAMP. The write data may be written to memory cell MC specified by row address XADD and column address YADD.

Clock signals CK and/CK may be received via clock terminals 114. A clock input circuit 170 may generate internal clock signals ICLK based on clock signals CK and/CK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 2:
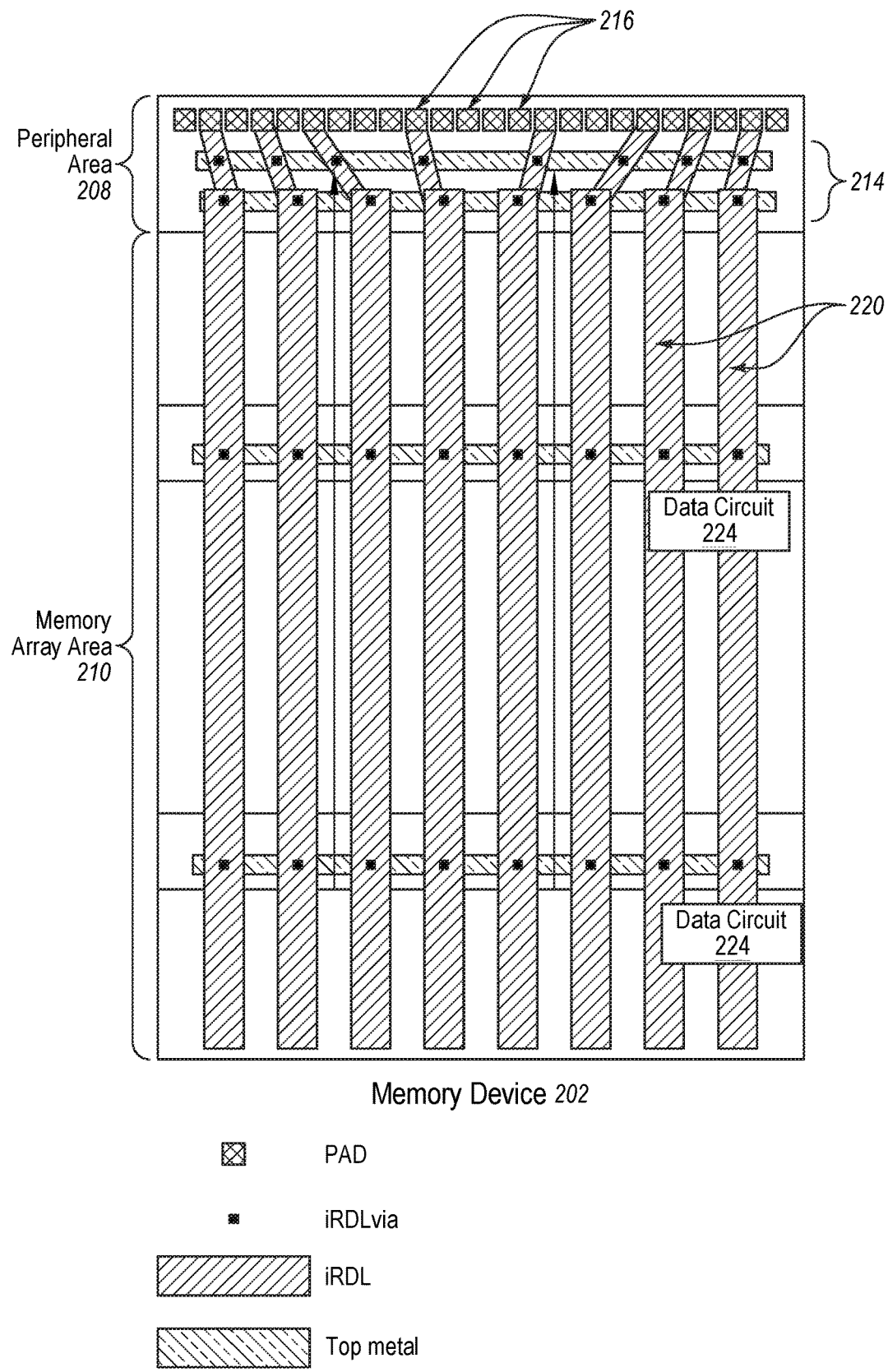
FIG. 2 illustrates an example layout diagram of a memory device.

FIG. 2 illustrates an example layout diagram of a memory device 202. The memory device 202 may be analogous to the memory device 100 of FIG. 1 and may include similar elements and features (an illustration of which may be omitted in FIG. 2). The memory device 202 includes a peripheral area 208 and a memory array area 210. The peripheral area 208 includes a peripheral redistribution layer 214 and one or more peripheral pads 216. Additionally, the peripheral area 208 may include one or more peripheral circuits (not shown). The memory array area 210 includes an array redistribution layer 220 and one or more data circuits 224. The memory array area 210 may include multiple memory cells (not shown).

The memory device 202 may be configured to store data in the memory cells of the memory array area 210. For example, each memory cell of the memory array area 210 may store a bit of data as a charge on one or more semiconductor components (e.g., as a charge on a capacitor or a charge stored in bistable latching circuitry, without limitation). The memory array area 210 may include, for example, memory array 102 in FIG. 1.

The data circuits 224 may include circuits or components related to the memory cells. The data circuits 224 may include, as non-limiting examples, one or more of a data bus buffer, a data amplifier, a sense amplifier, and an error-correction circuit.

As described above, the memory device 202 (including the memory array area 210 and the peripheral area 208) may allow for data to be read from and written to the memory cells. The peripheral area 208 may be configured to provide an interface for the memory device 202, e.g., so that other devices are able to read data from and/or write data to the memory cells.

The peripheral pads 216 may include, or may be coupled to, data terminals 116, data mask terminals 118, power supply terminal 120, and/or power supply terminal 122 shown in FIG. 1. Additionally or alternatively, peripheral pads 216 may include power supply pads and/or DQ pads.

Additionally or alternatively, the peripheral area 208 may include one or more power generator blocks (i.e., including a number of power supply pads), one or more data blocks (i.e., including a number of DQ pads), one or more address blocks, and/or other components that are not specifically shown in FIGS. 1 and 2. A data block may include an input receiver that receives an address input via an address pin and an address latch circuit that latches the address. A data block may also include an output buffer that outputs read data to a data I/O pin and/or an input receiver that receives write data supplied via the data I/O pin. An address block may include an address decoder that selects bit lines extending through memory array area 210 corresponding to respective addresses. For example, an address block may include a column address decoder of a column address block that may correspond to column decoder 106 of FIG. 1. Additionally or alternatively, an address block may include a row address decoder of a row address block that may correspond to row decoder 104 of FIG. 1. A power generator block may include a power source that supplies power to various circuit and components associated with the memory device 202. A power generator block may be provided along with one or more transmission lines or other power distribution lines that supply power from the power distribution block to the various components of the memory device 202. One of more of these blocks may be implemented as a circuit. Thus, the peripheral circuits may include, as non-limiting examples, a data bus buffer, an address-input circuit, a command-input circuit, a clock-input circuit, a voltage-input circuit, and a data-output circuit.

The memory device 202 may include various lines for transmitting electrical signals (including, e.g., word lines and bit lines (as described above with regard to FIG. 1)) (not show in FIG. 2). In addition to the various lines for transmitting electrical signals, the memory device 202 may include the peripheral redistribution layer 214 and the array redistribution layer 220. The peripheral redistribution layer 214 and the array redistribution layer 220 may be composed of one or more layers of distribution conductors (alternatively referred to as redistribution layers) and/or top metals interconnected by vias that electrically connect layers. For example, top metals and distribution conductors may form a network of conductive lines separated from other conductive lines by insulating layers. Various paths may be formed through the peripheral redistribution layer 214 and the array redistribution layer 220 by vias connecting separate layers. Additional detail regarding redistribution layers can be found in U.S. patent application Ser. No. 16/366,100, which is incorporated in its entirety for reference.

The memory device 202 includes a possibility of connection (through vias) between the peripheral redistribution layer 214 and the array redistribution layer 220. The connections between the peripheral redistribution layer 214 and the array redistribution layer 220 provide for power (e.g., from the peripheral pads 216) to be routed to the memory cells and the data circuits 224 of the memory array area 210. In this configuration (i.e., with power being routed from the peripheral pads 216 through the peripheral redistribution layer 214 and the array redistribution layer 220 to the memory array area 210) noise may be an issue. As a non-limiting example, the various lines transmitting electrical signals (including, e.g., the word lines and the bit lines) may be affected by crosstalk from the power signals of the peripheral redistribution layer 214 and/or the array redistribution layer 220. As another non-limiting example, data signals at data input and/or output pins may be affected by crosstalk from power signals at power input pins which may be near the data input and/or output pins.

Figure 3:
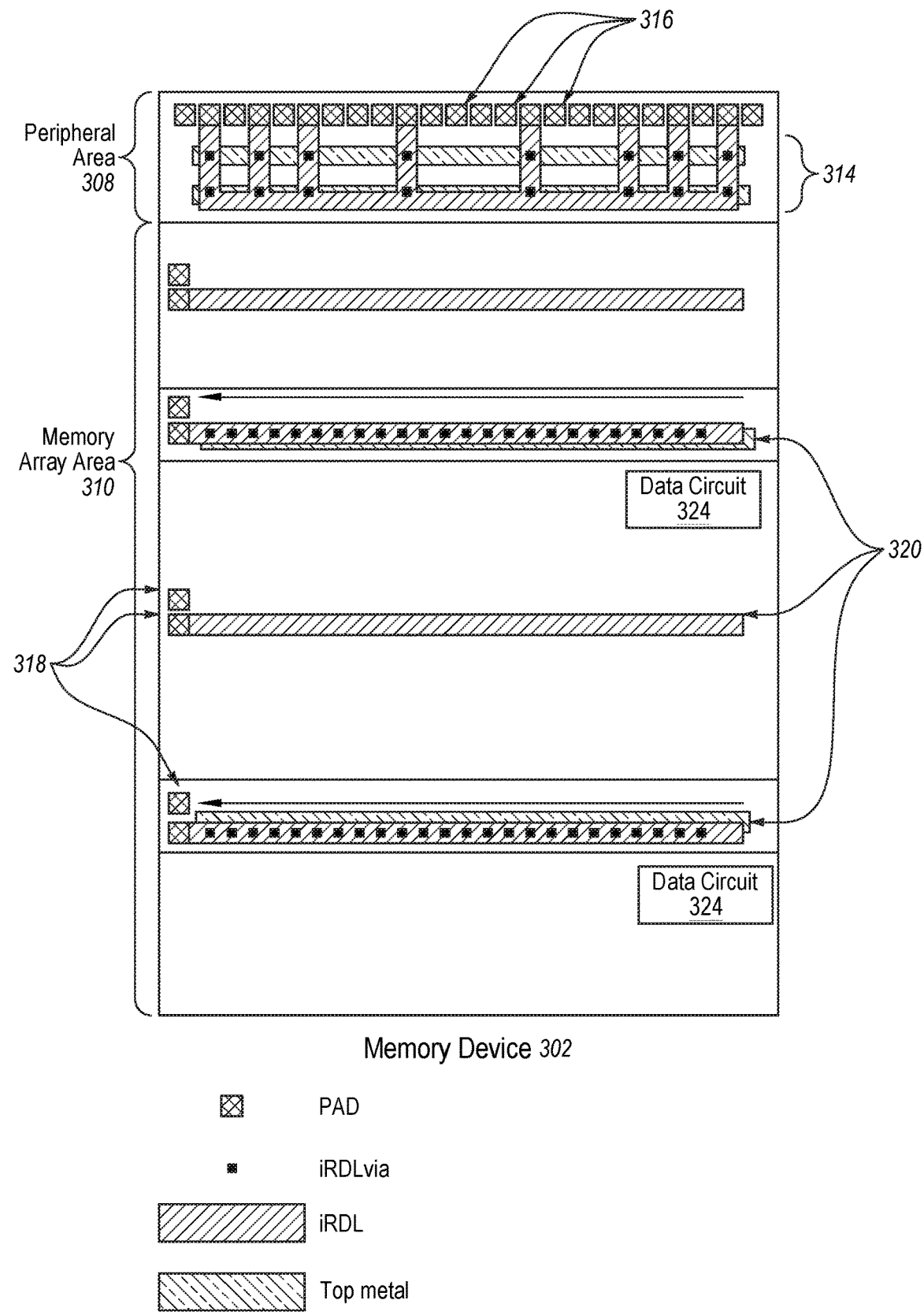
FIG. 3 illustrates an example layout diagram of a memory device, in accordance with at least one embodiment of the present disclosure.

FIG. 3 illustrates an example layout diagram of a memory device 302 in accordance with at least one embodiment of the present disclosure. The memory device 302 of FIG. 3 includes elements that are similar to, or the same as, elements from the memory device 202 of FIG. 2 (including those described but not illustrated). For example, a peripheral area 308 of the memory device 302 may include many of the same or similar elements of the peripheral area 208 of the memory device 202 FIG. 2. For example, the peripheral area 308 of the memory device 302 may include peripheral pads 316, a peripheral redistribution layer 314, and peripheral circuits similar to, or the same as the peripheral pads 216, the peripheral redistribution layer 214, and the peripheral circuits described above with regard to the memory device 202 of FIG. 2. Similarly, a memory array area 310 of the memory device 302 may include many of the same or similar elements of the memory array area 210 of the memory device 202 FIG. 2. For example, memory array area 310 may include memory cells (not shown in FIG. 3), an array redistribution layer 320, and one or more data circuits 324 that may be similar to, or the same as, the memory cells, array redistribution layer 220 and data circuits 224 described above with regard to the memory device 202 of FIG. 2. A description of the similarities will be omitted in favor of a description differences between the memory device 302 of FIG. 3 and the memory device 202 of FIG. 2.

The memory array area 310 may include array pads 318 which may be configured to receive an input voltage for powering the memory array area 310. The array pads 318 may be analogous to the peripheral pads 316 however, the array pads 318 may be arranged in the memory array area 310 and not in the peripheral area 308.

The array redistribution layer 320 may be configured to distribute power from the array pads 318 to the memory cells (and/or the data circuits 324) of the memory array area 310. Because the array pads 318 and the array redistribution layer 320 may receive and distribute power for the memory array area 310, in some embodiments, the peripheral pads 316 may not receive power for the memory array area 310. (E.g., the array pads 318 may receive all power required by the memory array area 310 and the peripheral pads may receive power for the peripheral area 308 without receiving any power for the memory array area 310.) Thus, the memory array area 310 may include fewer or different peripheral circuits and/or a different configuration of the peripheral redistribution layer 314.

The array redistribution layer 320 of the memory array area 310 may be electrically isolated from the peripheral redistribution layer 314 of the peripheral area 308. This electrical isolation may be provided by (at least) an absence of electrical connections between the array redistribution layer 320 and the peripheral redistribution layer 314. The electrical isolation may additionally include one or more insulating materials between the peripheral redistribution layer 314 and the array redistribution layer 320. It should be noted that there may be electrical connections between the memory array area 310 and the peripheral redistribution layer 314, e.g., in the form of word lines and bit lines (not shown). But, according to at least some embodiments, there may not be array distribution conductors, top metals, or vias electrically connecting the array redistribution layer 320 to the peripheral redistribution layer 314.

In some embodiments, this electrical isolation may reduce electrical interference (e.g., noise) between the electrical signals of the memory device 302 (e.g., data signals) and power transmission to and power redistribution within the memory device 302. As a non-limiting example, data input and output paths (e.g., through the bit lines), may include vertical data path segments in the memory device 202 of FIG. 2 and the memory device 302 of FIG. 3. The array redistribution layer 220 of FIG. 2 includes vertical array redistribution conductors that may run parallel to the vertical data path segments. The array redistribution layer 320 does not include vertical array redistribution layer segments. By not routing data signals (e.g., in the vertical data path segments) parallel to array redistribution conductors, electrical interference (e.g., crosstalk) between the data path segments and the array redistribution conductors may be lessened (e.g., compared with the memory device 202). This may be because electrical interference, e.g., through capacitive, inductive, or conductive coupling may be greater between two parallel lines than between two perpendicular lines.

Figure 4:
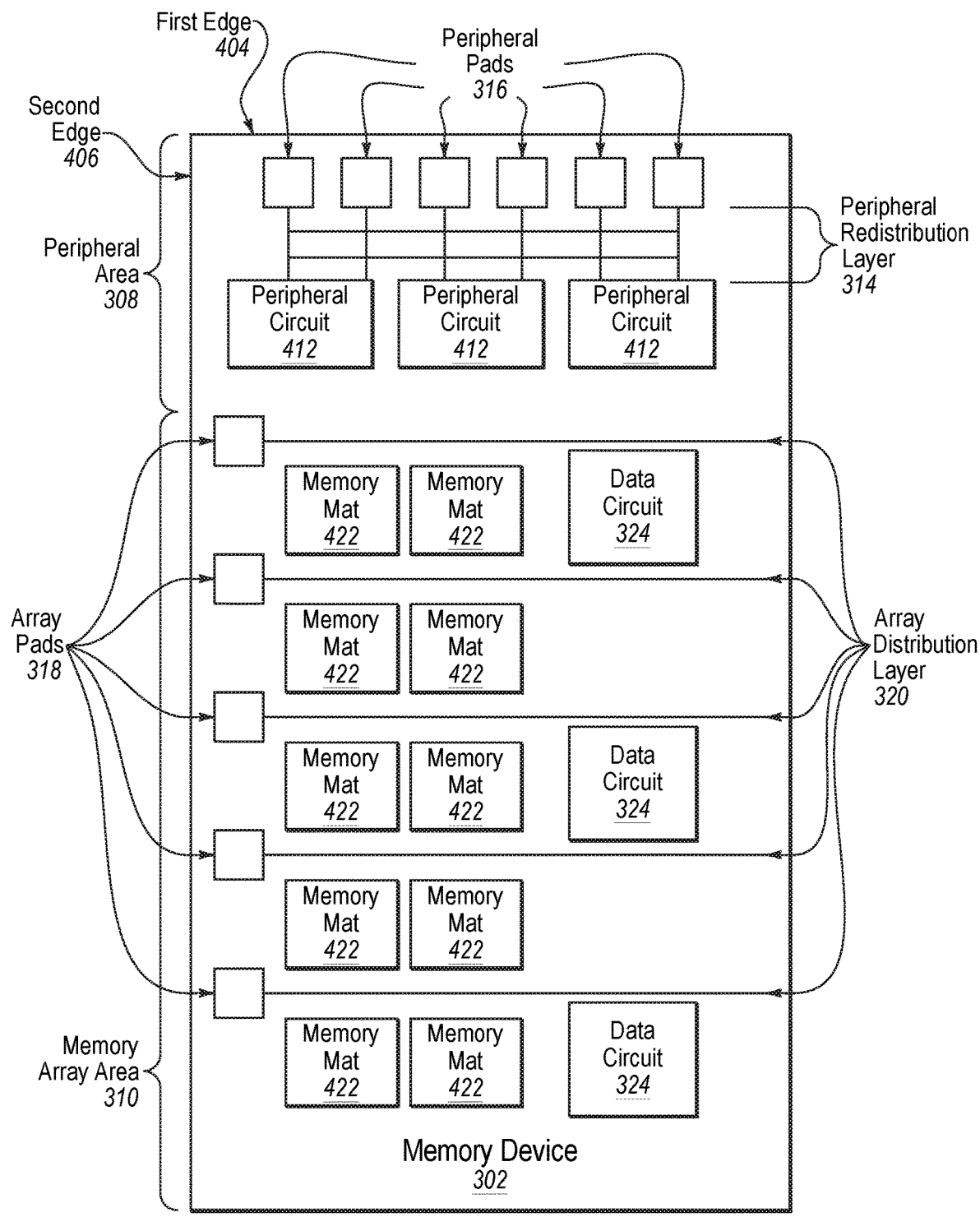
FIG. 4 illustrates another example layout diagram of the memory device of FIG. 3, in accordance with at least one embodiment of the present disclosure.

FIG. 4 illustrates another layout diagram of the memory device 302 of FIG. 3 in accordance with at least one embodiment of the present disclosure. The memory device 302 of FIG. 4 includes many of the same elements as the memory device 302 of FIG. 3. For example, the peripheral area 308, the memory array area 310, the peripheral redistribution layer 314, the peripheral pads 316, the array pads 318, the array redistribution layer 320, and the data circuit 324 may all be the same between the memory device 302 of FIG. 3 and the memory device 302 of FIG. 4.

FIG. 4 illustrates a first edge 404, and a second edge 406 of the memory device 302. The peripheral area 308 may be arranged proximate (e.g., along and/or adjacent) the first edge 404. The peripheral pads 316 may be included in the peripheral area 308. In some embodiments, the peripheral pads 316 may be arranged along the first edge 404.

In some embodiments, the array pads 318 within memory array area 310 may be arranged proximate (e.g., along and/or adjacent) the second edge 406. Arranging the array pads 318 along the second edge 406 may provide for a schematically simple, or convenient, interface between the memory device 302 and other devices.

FIG. 4 illustrates peripheral circuits 412 that are included in the peripheral area 308. As described above, the peripheral circuits 412 may include, as non-limiting examples, an address-input circuit, a command-input circuit, a clock-input circuit, a voltage-input circuit, and a data-output circuit.

FIG. 4 illustrates memory MATS 422 that are included in the memory array area 310. As will be appreciated, the memory MATS 422 may include a number of memory cells and possibly circuits and/or components configured to store data (e.g., SRAM cells or DRAM cells, without limitation).

Figure 5:
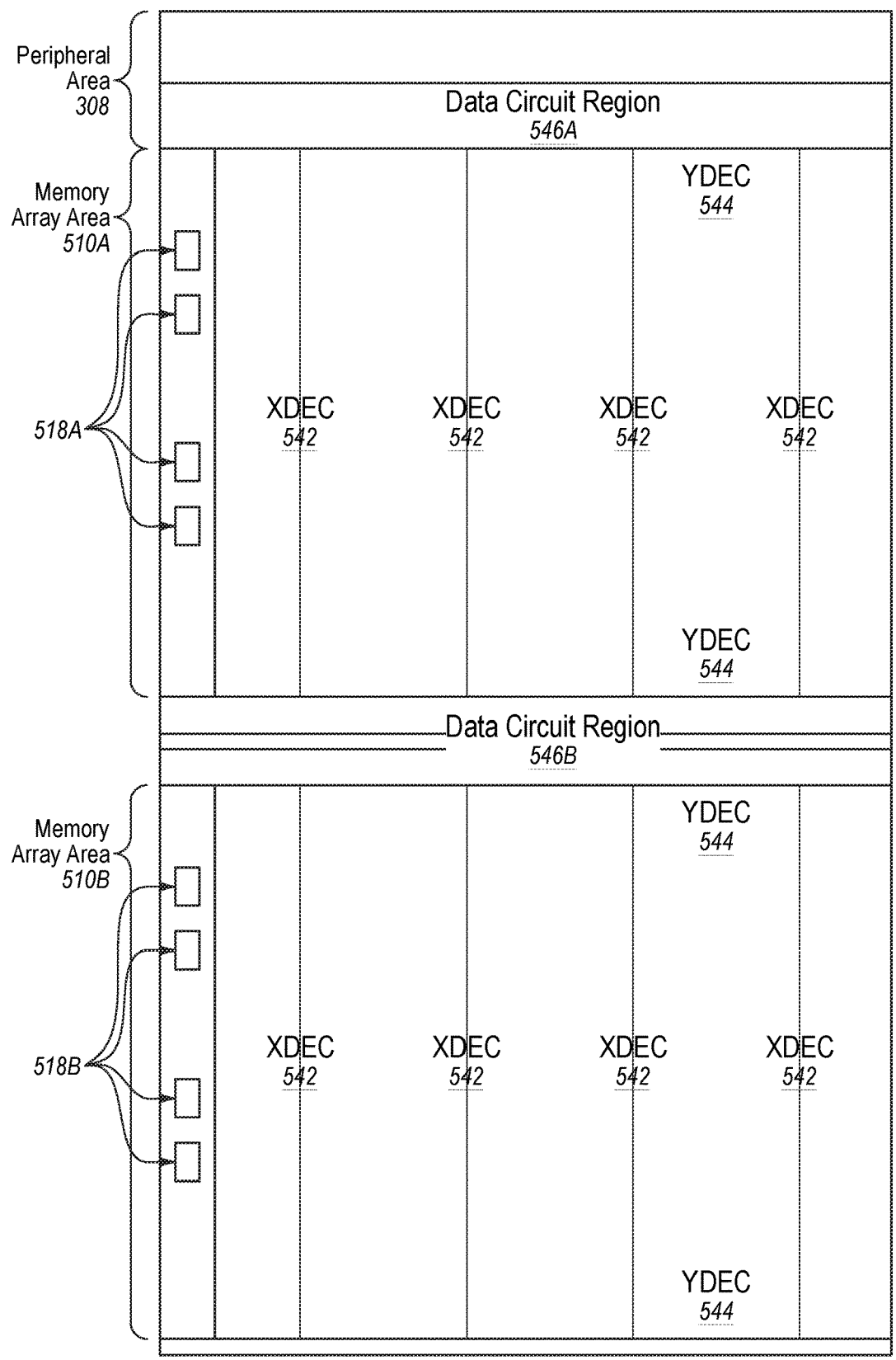
FIG. 5 illustrates another example layout diagram of a memory device, in accordance with at least one embodiment of the present disclosure.

FIG. 5 illustrates another example layout diagram of a memory device 502, in accordance with at least one embodiment of the present disclosure. The memory device 502 may be similar to the memory device 302 of FIGS. 3 and 4. The memory device 502 may include many of the same elements as the memory device 302 of FIGS. 3 and 4. For example, the peripheral area 308, the memory array area 510 (which is analogous to the memory array area 310 and which, in the memory device 502, is divided into a memory array area 510A and a memory array area 510B), a peripheral redistribution layer (not shown in FIG. 5), peripheral pads (not shown in FIG. 5), the array pads 518 (which are analogous to the array pads 318 and which, for illustrative purposes, are divided into array pads 518A and array pads 518B), an array redistribution layer (not shown in FIG. 5), and data circuits (not shown in FIG. 5) may all be the same between the memory device 302 of FIG. 3 and the memory device 502 of FIG. 5 Additionally, elements illustrated and discussed with regard to FIG. 5 may be present in the memory device 302 of FIGS. 3 and 4. Thus, the memory device 502 may be an example of an arrangement of elements of the memory device 302 of FIGS. 3 and 4.

In some embodiments, the memory device 502 may additionally include XDEC 542 (row decoders) and YDEC 544 (column decoders). As will be appreciated, the XDEC 542 and YDEC 544 may be configured to select bit lines and/or word lines such that data may be written to or read from memory cells of memory device 502.

In some embodiments, the memory device 502 may additionally include data circuit region 546A and data circuit region 546B. The data circuit regions may include data circuits, such as, for example, a data bus buffer, data sense amplifiers, error correction code circuits, and/or other circuits. The data circuits in the data circuit region may be configured to service the memory array by performing such operations as: amplification and error correction without limitation.

In some embodiments, the memory device 502 may be arranged to include two data circuit regions 546: a first data circuit region 546A (e.g., proximate to the peripheral area 208) and a second data circuit region 546B (e.g., proximate to a middle of the memory device 502). The data circuit region 546A may be configured to service a first segment of the memory array area 510 (e.g., the memory array area 510A). And the data circuit region 546B may be configured to service a second segment of the memory array 510 (e.g., the memory array area 510B).

In some embodiments, the array redistribution layer of the memory array area 510 may extend over each of the data circuit regions 546. In particular, a redistribution conductor may extend along (e.g., above) each of the data circuit regions 546.

Because of the redistribution conductors extending along the data circuit regions 546, power supplied to and signals from the data circuit regions 546 may be separated from data signals to and from the memory cells. In particular, the data paths from the memory cells may be electrically isolated (e.g., by physical and electrical separation) from the electrical signals between the array pads 518 and the data circuit regions 546.

Figure 6:
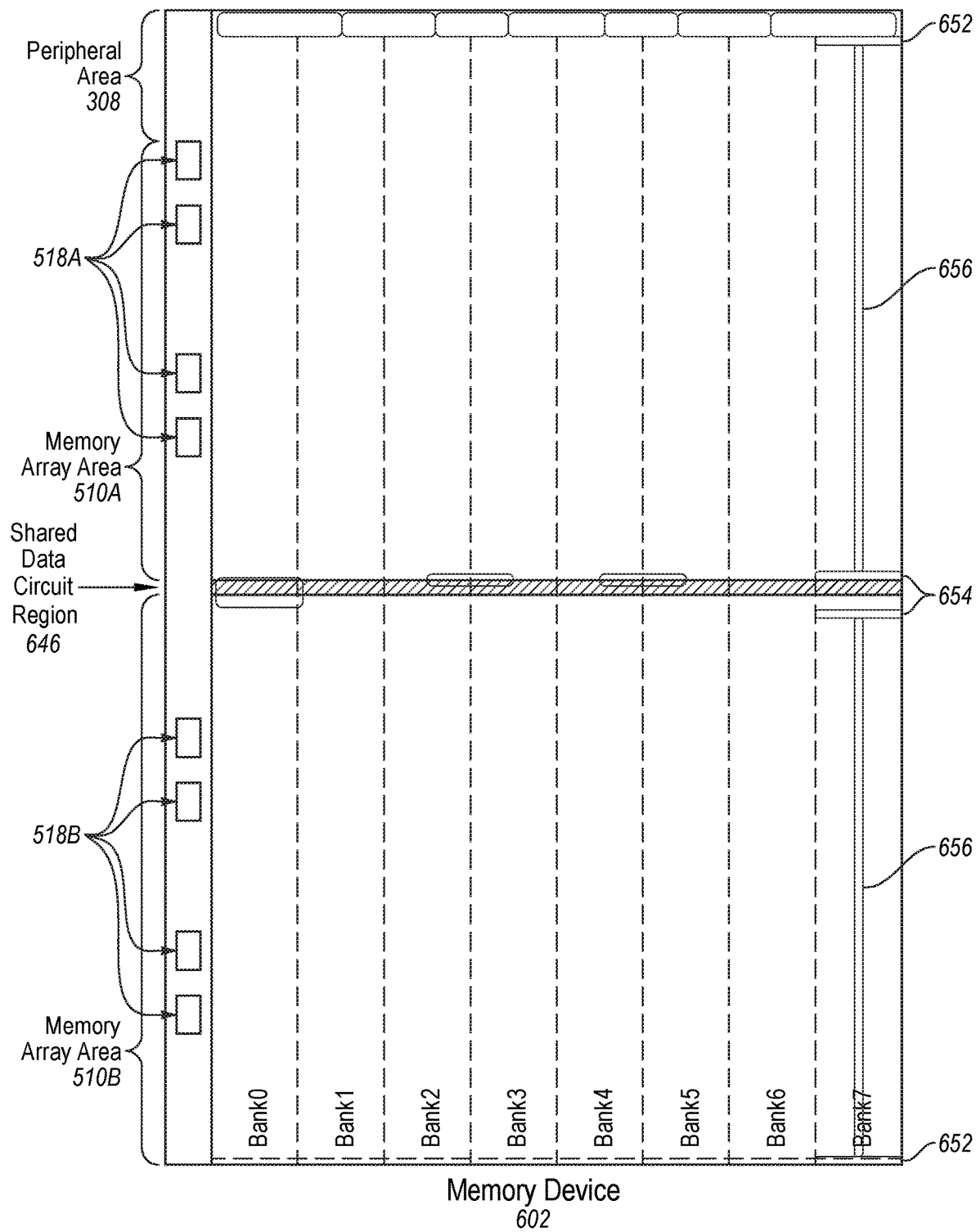
FIG. 6 illustrates yet another example layout diagram of a memory device, in accordance with at least one embodiment of the present disclosure.

FIG. 6 illustrates yet another example layout diagram of a memory device 602, in accordance with at least one embodiment of the present disclosure. The memory device 602 may be similar to the memory device 302 of FIGS. 3 and 4 and the memory device 502 of FIG. 5. The memory device 602 may include many of the same elements as the memory device 302 of FIGS. 3 and 4 and the memory device 502 of FIG. 5. For example, the peripheral area 308, the memory array area 510 (including a memory array area 510A and a memory array area 510B), a peripheral redistribution layer (not shown in FIG. 6), peripheral pads (not shown in FIG. 6), the array pads 518 (including array pads 518A and array pads 518B), an array redistribution layer (not shown in FIG. 6), and data circuits (not shown in FIG. 6) may all be the same between the memory device 302 of FIG. 3 and the memory device 602 of FIG. 6 Additionally, element illustrated and discussed with regard to FIG. 6 may be present in the memory device 302 of FIGS. 3 and 4. Thus, the memory device 602 may be an example of an arrangement of elements of the memory device 302 of FIGS. 3 and 4.

In contrast to the data circuit regions 546 of FIG. 5, the memory device 602 may include a shared data circuit region 646. The shared data circuit region 646 may include many of the same elements as the data circuit regions 546 however, the shared data circuit region 646 may be configured to service twice as many memory cells as the data circuit regions 546. Thus, the shared data circuit region 646 may include more or larger elements configured to service twice as many memory cells.

Additionally, the memory device 602 may include decoder ("BCYdecFar") 652 and decoder ("BCYdecNear") 654 in place of the YDEC 544. The decoder 652 and the decoder 654 may be the same or similar, the difference being that the decoder 654 may be positioned closer to the shared data circuit region 646 than the decoder 652. Additionally, the memory device 602 may include a decoder 656 in place of the XDEC 542.

As with the memory device 502 of FIG. 5, the memory device 602 may include a redistribution conductor along (e.g., above) the shared data circuit region 646. The redistribution conductor may provide power to the various circuits of the shared data circuit region 646.

The layout diagrams shown in FIGS. 3-6 are provide as example layout and other layouts according to the same principle are possible.

Figure 7:
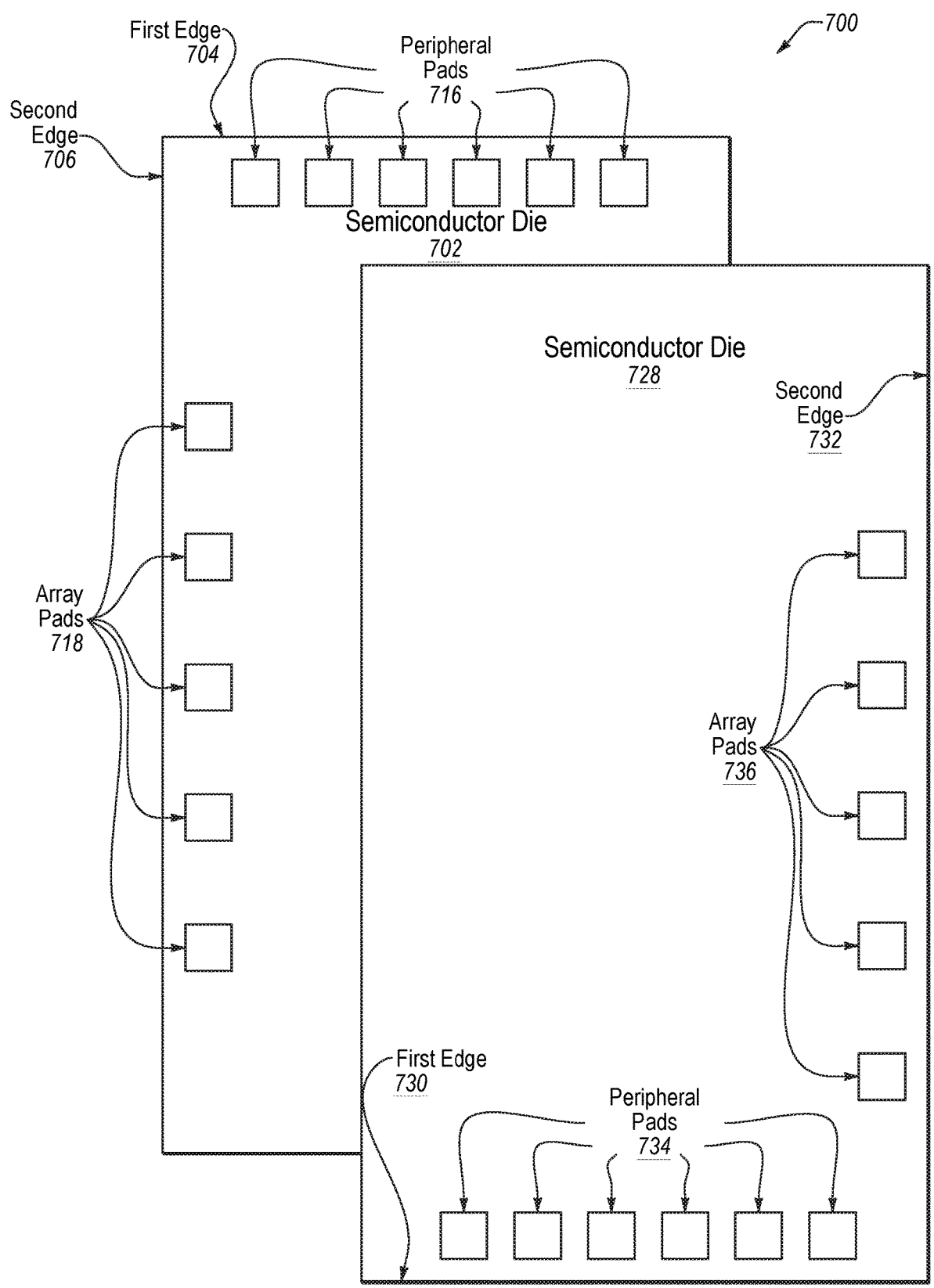
FIG. 7 illustrates an example semiconductor-device package, in accordance with at least one embodiment of the present disclosure.

FIG. 7 illustrates a semiconductor-device package 700 in accordance with at least one embodiment of the present disclosure. The semiconductor-device package 700 includes a first semiconductor die 702 and a second semiconductor die 728. Each of the first semiconductor die 702 and the second semiconductor die 728 may include an embodiment of the memory device 302 of FIG. 3 and FIG. 4. In some embodiments, the first semiconductor die 702 and the second semiconductor die 728 may be the same or have the same layout and components. In other embodiments the first semiconductor die 702 and the second semiconductor die 728 may have different layouts and components (e.g., without limitation), yet the first semiconductor die 702 and the second semiconductor die 728 may both have peripheral pads (e.g., within a peripheral area arranged along a respective first edge), and array pads (e.g., within a memory array area arranged along a respective second edge).

For example, the first semiconductor die 702 may include a first edge 704, a second edge 706, peripheral pads 716, and array pads 718 and the second semiconductor die 728 may include a first edge 730, a second edge 732, peripheral pads 734, and array pads 736. In some embodiments, each of the first semiconductor die 702 and the second semiconductor die 728 may include a peripheral area (not shown) (such as the peripheral area 308 of FIG. 3 and FIG. 4) and a memory array area (not shown) (such as the memory array area 310 of FIG. 3 and FIG. 4). Other elements of the first semiconductor die 702 and the second semiconductor die 728 have been omitted from FIG. 7 to focus on the details of the semiconductor-device package 700.

The semiconductor-device package 700 includes the second semiconductor die 728 stacked on the first semiconductor die 702. In some embodiments, a layer (e.g., insulating or partially insulating and partially conductive (e.g., a redistribution layer)) may exist between the second semiconductor die 728 and the first semiconductor die 702.

In the semiconductor-device package 700, the second semiconductor die 728 may the same as, and rotated (e.g., 180 degrees) relative to, the first semiconductor die 702. The first edge 730 of the second semiconductor die 728 (including the peripheral pads 734, and in some embodiments, the peripheral area) may be arranged opposite the first edge 704 of the first semiconductor die 702. Similarly the second edge 732 (including the array pads 736) may be arranged opposite the second edge 706 of the first semiconductor die 702.

Additionally, in some embodiments, the second semiconductor die 728 may be offset relative to the first semiconductor die 702 (e.g., such that one or both of the peripheral pads 716 and the array pads 718 of the first semiconductor die 702 is not directly below the second semiconductor die 728). Stacking and offsetting in this manner may provide space for electrical connections to be formed with the peripheral pads 716, the array pads 718, the peripheral pads 734 and the array pads 736.

The semiconductor-device package 700 may additionally include one or more additional semiconductor devices stacked above the second semiconductor die 728. The additional semiconductor devices may be oriented and positioned above the second semiconductor die 728 in the same way that the second semiconductor die 728 is oriented and positioned above the first semiconductor die 702. More specifically, a third semiconductor device (not shown) may be stacked above the second semiconductor die 728 and may be positioned and oriented in substantially the same way as the first semiconductor die 702 such that the first edge of the third semiconductor device is substantially aligned with (e.g., above) the first edge 704 of the first semiconductor die 702 and the second edge of the third semiconductor device is substantially aligned with (e.g., above) the second edge 706 of the first semiconductor die 702. The peripheral pads of the third semiconductor device may be substantially aligned with (e.g., directly above) the peripheral pads 716 of the first semiconductor die 702 and the array pads of the third semiconductor device may be substantially aligned with (e.g., directly above) the array pads 718 of the first semiconductor die 702.

By stacking and orienting the three or more semiconductor devices in this way, there is at least a thickness of one semiconductor die (e.g., the second semiconductor die 728) between the peripheral pads of a semiconductor die (e.g., the first semiconductor die 702) and the bottom of the semiconductor device above the peripheral pads (e.g., the third semiconductor die).

A memory system is also disclosed. According to various embodiments, the memory system may include a controller and a number of memory devices. Each memory device may include one or more memory cell arrays, which may include a number of memory cells.

FIG. 8 is a simplified block diagram of a memory system 800 implemented according to one or more embodiments described herein. Memory system 800, which may include, for example, a semiconductor device, includes a number of memory devices 802 and a controller 804. For example, at least one memory device 802 may include one or more interface configurations, as described herein. In at least one embodiment, the memory system 800 may include the semiconductor-device package 700 shown in FIG. 7. Controller 804 may be operatively coupled with memory devices 802 so as to convey command/address signals (e.g., command/address signals received by command terminals 112 and/or address terminals 110 of FIG. 1) to memory devices 802.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 9 is a simplified block diagram of an electronic system 900 implemented according to one or more embodiments described herein. Electronic system 900 includes at least one input device 902, which may include, for example, a keyboard, a mouse, or a touch screen. Electronic system 900 further includes at least one output device 904, such as a monitor, a touch screen, or a speaker. Input device 902 and output device 904 are not necessarily separable from one another. Electronic system 900 further includes a storage device 906. Input device 902, output device 904, and storage device 906 may be coupled to a processor 908. Electronic system 900 further includes a memory device 910 coupled to processor 908. Memory device 910 which may include memory system 800 of FIG. 8. Electronic system 900 may include, for example, a computing, processing, industrial, or consumer product. For example, without limitation, electronic system 900 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Some embodiments of the present disclosure may include a semiconductor device including a peripheral area and a memory array area. The peripheral area may include a number of peripheral pads for interfacing with the semiconductor device. The memory array area may include a number of memory cells and a number of array pads configured to receive an input voltage.

Some embodiments of the present disclosure may include a semiconductor device including a peripheral area and a memory array area. The peripheral area may be arranged proximate to a first edge of the semiconductor device. The memory array area may include a memory cell and an array pad configured to receive an array input voltage. The array pad may be arranged proximate to a second edge of the semiconductor device. The second edge may be perpendicular to the first edge. The memory array area may also include an array distribution conductor configured to electrically connect the memory cell to the array pad.

Some embodiments of the present disclosure may include a semiconductor-device package including a first semiconductor device and a second semiconductor device. Each of the first semiconductor device and the second semiconductor device may include a first edge, a second edge perpendicular to the first edge, a peripheral area arranged adjacent to the first edge, and a memory array area. The peripheral area may include a number of peripheral pads. The memory array area may include a number of memory cells, a number of array pads arranged adjacent to the second edge, and an array redistribution layer. The array distribution layer may be configured to variously electrically connect the number of memory cells to the number of array pads.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A semiconductor device, comprising:
a semiconductor die comprising:
a memory array area comprising:
a number of memory cells; and
a number of array pads configured to receive an input voltage; and
a peripheral area comprising a number of peripheral pads for interfacing with the memory array area.

2. The semiconductor device of claim 1, wherein the memory array area comprises an array redistribution layer configured to variously electrically connect the number of array pads to the number of memory cells.

3. The semiconductor device of claim 2, wherein the peripheral area includes a number of peripheral circuits and a peripheral redistribution layer configured to variously electrically connect the number of peripheral pads to the number of peripheral circuits, and wherein the array redistribution layer is electrically isolated from the peripheral redistribution layer.

4. The semiconductor device of claim 1, wherein the peripheral area is arranged proximate to a first edge of the semiconductor device and the number of array pads are arranged adjacent to a second edge of the semiconductor device, the second edge being perpendicular to the first edge.

5. The semiconductor device of claim 4, wherein the memory array area comprises an array redistribution layer configured to variously electrically connect the number of array pads to the number of memory cells and the array redistribution layer includes a number of array distribution conductors which extend over the memory array area in a direction parallel to the first edge.

6. The semiconductor device of claim 1, wherein the peripheral area includes a number of peripheral circuits and a peripheral redistribution layer configured to variously electrically connect the number of peripheral pads to the number of peripheral circuits.

7. The semiconductor device of claim 1, wherein the peripheral area comprises one or more of: a data bus buffer, an address-input circuit, a command-input circuit, a clock-input circuit, a voltage-input circuit, and a data-output circuit.

8. A semiconductor device, comprising:
a peripheral area arranged proximate to a first edge of the semiconductor device; and a memory array area comprising:
a memory cell;
an array pad configured to receive an input voltage, the array pad arranged proximate to a second edge of the semiconductor device, the second edge perpendicular to the first edge; and
an array distribution conductor configured to electrically connect the memory cell to the array pad.

9. The semiconductor device of claim 8, wherein the peripheral area comprises:
a peripheral circuit; a peripheral pad; and
a peripheral distribution conductor configured to electrically connect the peripheral circuit to the peripheral pad.

10. The semiconductor device of claim 9, wherein the peripheral circuit comprises one or more of: an address-input circuit, a command-input circuit, a clock-input circuit, a voltage-input circuit, or a data-output circuit.

11. The semiconductor device of claim 9, wherein the array distribution conductor is electrically isolated from the peripheral distribution conductor.

12. The semiconductor device of claim 8, wherein the memory array area comprises
a data circuit and the array distribution conductor is configured to electrically connect the data circuit to the array pad.

13. The semiconductor device of claim 12, wherein the data circuit comprises one
or more of: a data bus buffer, a data amplifier, a sense amplifier, and an error-correction circuit.

14. The semiconductor device of claim 12, wherein the array distribution conductor extends, in a direction parallel to the first edge, between the array pad and the data circuit.

15. The semiconductor device of claim 8, the memory array area comprising:
- a second memory cell;
- a second array pad arranged adjacent to the second edge; and
- an array redistribution layer configured to electrically connect the second memory cell to the second array pad, the array distribution conductor being part of the array redistribution layer.

16. The semiconductor device of claim 15, the peripheral area comprising a
- peripheral redistribution layer configured to electrically connect a first peripheral circuit to a first peripheral pad and a second peripheral circuit to a second peripheral pad, the peripheral redistribution layer electrically isolated from the array redistribution layer.

17. The semiconductor device of claim 8, wherein a length of the second edge is longer than a length of the first edge.

18. A semiconductor-device package comprising:
- a first semiconductor device and a second semiconductor device, each of the first semiconductor device and the second semiconductor device comprising:
  - a first edge;
  - a second edge perpendicular to the first edge;
  - a peripheral area arranged proximate to the first edge, the peripheral area including a number of peripheral pads; and
  - a memory array area comprising: a number of memory cells;
  - a number of array pads arranged proximate to the second edge; and
  - an array redistribution layer configured to variously electrically connect the number of memory cells to the number of array pads; and
- wherein the second semiconductor device is stacked above the first semiconductor device such that
  - the first edge of the second semiconductor device is opposite the first edge of the first semiconductor device and the second edge of the second semiconductor device is opposite the second edge of the first semiconductor device.

19. The semiconductor-device package of claim 18, wherein the second semiconductor device is offset from the first semiconductor device such that the second semiconductor device is not directly above either of the number of peripheral pads of the first semiconductor device and the number of array pads of the first semiconductor device and the first semiconductor device is not directly below either of the number of peripheral pads of the second semiconductor device and the number of array pads of the second semiconductor device.

20. The semiconductor-device package of claim 18, further comprising: a third semiconductor device comprising:
- a first edge;
- a second edge perpendicular to the first edge of the third semiconductor device;
- a peripheral area arranged adjacent to the first edge of the third semiconductor device, the peripheral area of the third semiconductor device including a number of peripheral pads; and
- a memory array area comprising:
- a number of memory cells;
- a number of array pads arranged adjacent to the second edge of the third semiconductor device; and
- an array redistribution layer configured to variously electrically connect the number of memory cells of the third semiconductor device to the number of array pads of the third semiconductor device; and
- wherein the third semiconductor device is stacked above the second semiconductor device such that
  - the first edge of the third semiconductor device is opposite the first edge of the second semiconductor device and the second edge of the third semiconductor device is opposite the second edge of the second semiconductor device.

21. An electronic system, comprising: at least one input device;
- at least one output device;
- at least one processor device operably coupled to the input device and the output device; and at least one memory device operably coupled to the at least one processor device and
- comprising:
- a semiconductor die comprising:
- a memory array area comprising:
- at least one memory cell; and
- at least one array pad configured to receive power for the at least one memory cell; and
- a peripheral area comprising at least one peripheral pad configured to provide data to and receive data from the at least one memory cell.

* * * * *

UNITED STATES PATENT AND TRADEMARK OFFICE
CERTIFICATE OF CORRECTION

PATENT NO. : 11,251,148 B2
APPLICATION NO. : 16/774911
DATED : February 15, 2022
INVENTOR(S) : Hisamitsu Kimoto It is certified that error appears in the above-identified patent and that said Letters Patent is hereby corrected as shown below:

In the Specification
Column 3, Line 58, change "BL) and/BL," to --BL) and /BL,--
Column 3, Line 60, change "BL and/BL," to --BL and /BL,--
Column 3, Line 62, change "BL and/BL," to --BL and /BL,--
Column 4, Line 5, change "BL and/BL," to --BL and /BL,--
Column 4, Line 6, change "BL or/BL," to --BL or /BL,--
Column 4, Line 15, change "BL or/BL," to --BL or /BL,--
Column 4, Line 65, change "CK and/CK" to --CK and /CK--
Column 5, Line 1, change "and/CK." to --and CK.--

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*